United States Patent [19]

Huie et al.

[11] 4,388,136
[45] Jun. 14, 1983

[54] METHOD OF MAKING A POLYIMIDE/GLASS HYBRID PRINTED CIRCUIT BOARD

[75] Inventors: Jaken Y. Huie, Apple Valley, Minn.; Dan Jacobus, Glendale, Wis.

[73] Assignee: Sperry Corporation, New York, N.Y.

[21] Appl. No.: 191,651

[22] Filed: Sep. 26, 1980

[51] Int. Cl.³ ............................................ B32B 31/00
[52] U.S. Cl. .................................... 156/252; 156/253; 156/267; 156/306.6; 174/68.5; 428/901
[58] Field of Search ....................... 156/252, 253, 267; 428/901; 174/68.5

[56] References Cited

U.S. PATENT DOCUMENTS

| | | | |
|---|---|---|---|
| 3,626,586 | 12/1971 | Huie et al. | 174/68.5 |
| 3,739,469 | 6/1973 | Dougherty | 174/68.5 |
| 3,760,091 | 9/1973 | Cannizzaro et al. | 174/68.5 |
| 4,030,190 | 6/1977 | Varker | 174/68.5 |

OTHER PUBLICATIONS

IBM Technical Disclosure Bulletin, "Use of Polyimide to Obtain a Smooth Surface", 1978, p. 3020.

*Primary Examiner*—Caleb Weston
*Attorney, Agent, or Firm*—Kenneth T. Grace; Marshall M. Truex

[57] ABSTRACT

A method of fabricating a "hybrid" multilayer printed circuit board combining two dissimilar plastic layers of polyimide resin/glass and of epoxy resin/glass laminates. The finished hybrid multilayer printed circuit board is for, e.g., the support of and electrical interconnection to a plurality of magnetizable memory cores. The method includes sandwiching a plurality of epoxy-glass printed circuit boards having the desired copper patterns on both sides between two polyimide-glass printed circuit boards, each having the desired copper pattern on only one side. All the printed circuit boards are laminated with epoxy-glass prepreg to form a single hybrid multilayer printed circuit board consisting of the sandwiched epoxy-glass printed circuit boards and the sandwiching polyimide-glass printed circuit boards. Interconnections between patterned layers are formed by copper-plate throughholes.

2 Claims, 5 Drawing Figures

METHOD OF MAKING A POLYIMIDE/GLASS HYBRID PRINTED CIRCUIT BOARD

BACKGROUND OF THE INVENTION

In the prior art it is known that multiple layer printed circuit boards have been used as a means for the support of and electrical interconnection to a plurality of magnetizable memory cores—see the J. Y. Huie, et al, U.S. Pat. No. 3,626,586—or for the routing of complex electrical circuit paths including signal, ground and voltage planes—see the K. J. Varker U.S. Pat. No. 4,030,190. Such multilayer printed circuit boards include patterns of "via" holes and "through" holes for the inter-layer inter-connection of the circuit paths on the several printed circuit boards—see the W. E. Dougherty, Jr. U.S. Pat. No. 3,739,469.

Epoxy resin/glass laminates of an epoxy-glass layer having conductive layers affixed thereto are formed into multilayer printed circuit blards using laminating layers of epoxy prepeg under appropriate pressure and temperature. See the publications "Design and Fabrication of Multilayer Printed Circuit Boards", R. G. Greygoose, et al, Solid State Technology, November 1970, pp. 33–40, and "Double-Multilayer Printed Wiring Boards. A Novel Technique to Overcome a Packing Density Problem", B. R. Smith, Internepcon, 1976, pp. 41–45. However, such epoxy resin/glass multi-layer printed circuit boards have low heat resistance, poor dimensional stability, high coefficient of thermal expansion and a less than desirable dielectric constant at high frequencies. These deficiencies, however, are acceptable in many applications and are compensated for by relatively low material cost and straight-forward and inexpensive fabrication methods.

However, in applications requiring very high current densities, the deficiencies of epoxy resin/glass multi-layer printed circuit boards are not acceptable. In such applications, the computer industry has employed multilayer printed circuit boards formed of polyimide resin/glass laminates. See the publications "The Development of Polyimide Multilayer Boards Containing Integral Flexible Circuitry", J. R. Cannizzaro, Internepcon 1970, pp. I-70-40, and "Multilayer Printed Wiring Boards for Demanding Environmental Applications", W. S. Rigling, Internepcon Europa, 1973, pp. 6–12. Such polyimide resin/glass multilayer printed circuit boards have high heat resistance, good dimensional stability, low coefficient of thermal expansion and desirable dielectric constant; however, such desirable characteristics are accompanied by relatively high material cost and expensive fabrication methods.

In the J. R. Cannizzaro, et al, U.S. Pat. No. 3,760,091 there is taught the fabrication of multilayer printed circuit boards formed of layers of substantially hydrophilic material, e.g., epoxy-glass, having conductive layers, e.g., copper, therebetween. Layers of substantially hydrophobic material e.g., polyimide-glass, are sandwiched therebetween. Through-holes are electroless copper plated with the copper adhering to all layers except the polyimide layers forming a series of via holes along the through-holes forming independent connections between the sandwiching polyimide layers. In this configuration the bonding layers, used to bond the glass-epoxy layers, the conductive layers and the polyimide layers, consist of layers of B stage prepreg containing an epoxy resin.

SUMMARY OF THE INVENTION

In the present invention, the lower cost, lower heat conductivity epoxy-glass laminate is combined with the higher cost, higher heat conductivity polyimide-glass laminate to provide an improved multilayer printed circuit board. Use of the polyimide-glass laminate as the external sandwiching layers permits the high temperature soldering and/or welding of electrical wiring to external terminal pads on the polyimide-glass laminate without degrading the bonding strength to that which would be provided if the epoxy-glass laminate were the external sandwiching layers. Thus, reduced terminal pad separation from the supporting laminate and improved reliability, e.g., adhesion, of the copper printed circuit patterns are provided while reducing multilayer printed circuit board cost. A unique feature of the present invention is the ability to fabricate the hybrid multilayer printed circuit board while using the same assembly processes used to fabricate multilayer printed circuit boards of epoxy-glass laminates. Further, use of the polyimide-glass laminate as the terminal pad supporting medium permits the use of smaller area terminal pads and a more densely compacted copper printed circuit pattern formed thereupon.

DESCRIPTION OF THE PREFERRED EMBODIMENTS

Figure 1:
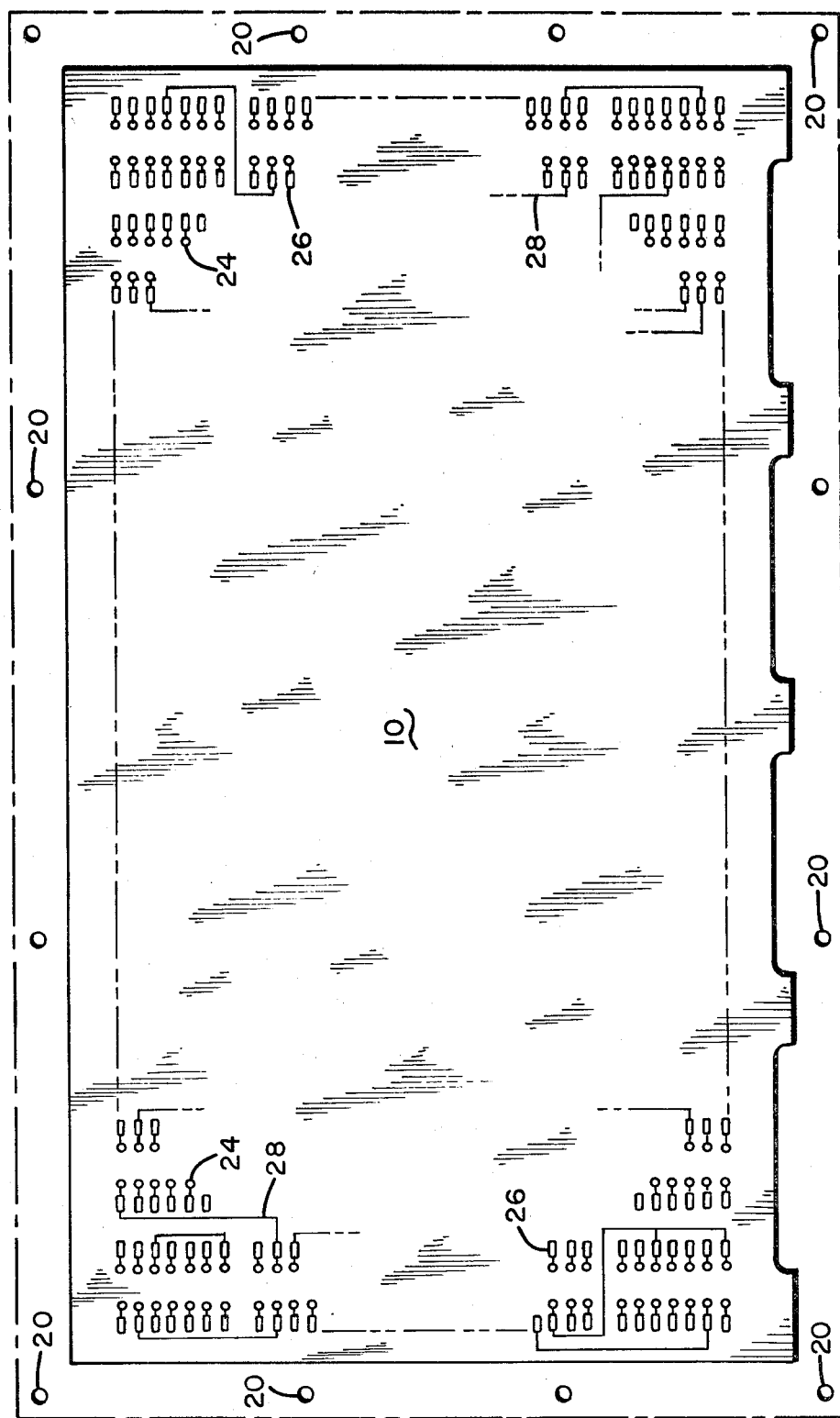
FIG. 1 is a plan view of the hybrid printed circuit board of the present invention.

With particular reference to FIG. 1 there is illustrated a single multi-layer printed circuit board 10 in which a plurality of epoxy-glass-base boards are sandwiched between two, top and bottom, polyimide-glass-base boards for forming the hybrid printed circuit board of the present invention. The multi-layered printed circuit board of the present invention is fabricated by the following novel method:

a. cutting to rough size a plurality of double-copper-clad epoxy-glass-base boards;

b. forming patterns in the top and bottom copper layers of said epoxy-glass-base boards;

c. cutting to rough size two single-copper-clad polyimide-glass-base boards;

d. forming a pre-laminated structure by sandwiching said plurality of said epoxy-glass-base boards between said two polyimide-glass-base boards with the copper layers thereon exposed and with one or more layers of B stage prepreg containing an epoxy resin inserted between each of said sandwiched and sandwiching boards;

e. forming a laminating structure of said prelaminated structure by applying pressure and heat thereto;

f. forming through-holes in said laminated structure;

g. forming patterns in the copper layers of said polyimide-glass-base boards; and, h. trimming said laminated structure to final size.

Figure 2:
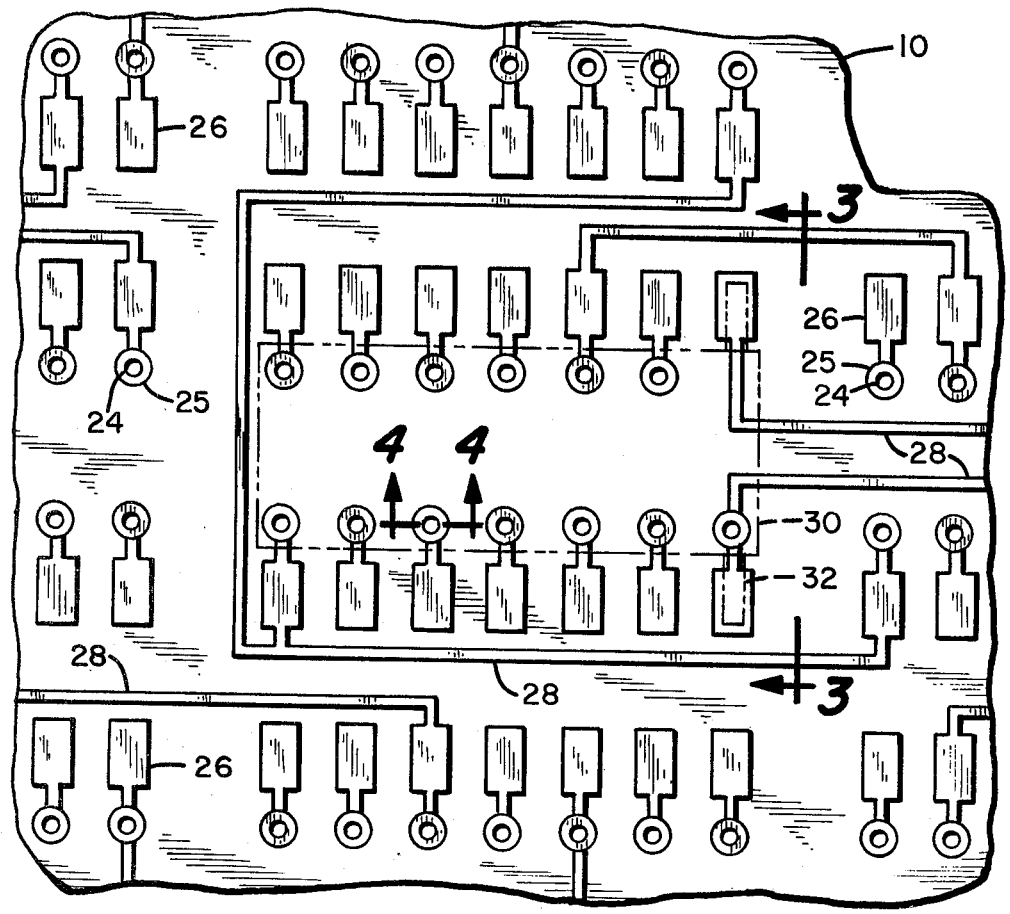
FIG. 2 is an enlarged plan view of a portion of the hybrid printed circuit board illustrating a typical LSI component mounting pad pattern and related through-hole pattern.

With particular reference to FIG. 2 there is presented an enlarged view of the multi-layer printed circuit board 10 of FIG. 1. Multi-layer printed circuit board 10 is illustrated as containing a plurality of copper conductor elements affixed to the top surface of the top polyimide-base-board 12. Such copper conductor elements include a plurality of plated through-holes 24 and termination pads 26. Also illustrated are a plurality of printed circuit conductors 28 for interconnecting associated termination pads 26/plated through-holes 24 on the top surface of board 12. Each of the plated through-holes 24 has a washer-like ring 25 on the top and bottom surfaces of the top and bottom polyimide-base-boards 12 and 13 for ensuring the electrical and physical continuity of the plated through-holes 24 are for coupling the plated through-holes 24 to the termination pads 26. Termination pads 26 are utilized as the means whereby the large scale integrated (LSI) circuits are electrically and mechanically affixed to multi-layer printed circuit board 10.

Figure 3:
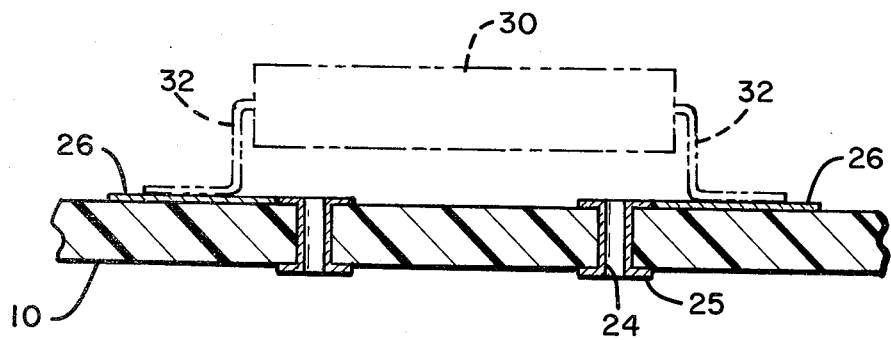
FIG. 3 is a cross-sectional view of the hybrid printed circuit board of FIG. 2 taken along line 2—2 at a through-hole thereof.

With particular reference to FIG. 3 there is presented a cross-sectional view of multi-layer printed circuit board 10 taken along line 3—3 of FIG. 2 for the purpose of illustrating the manner in which the LSI circuit 30 is, via its legs 32, affixed to the termination pads 26 which are electrically and mechanically integral with the plated through-holes 24.

Figure 4:
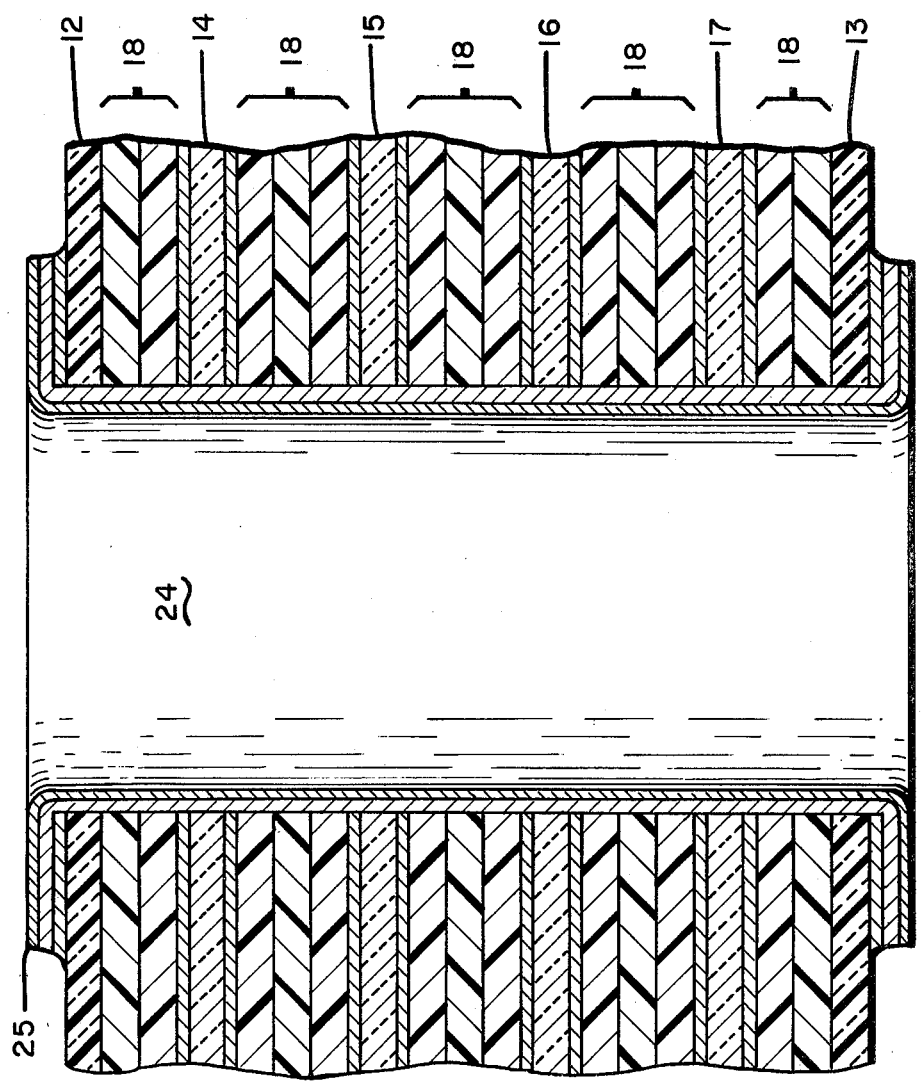
FIG. 4 is a cross-sectional view of the hybrid printed circuit board of FIG. 2 taken along line 4—4 of FIG. 2.
Figure 5:
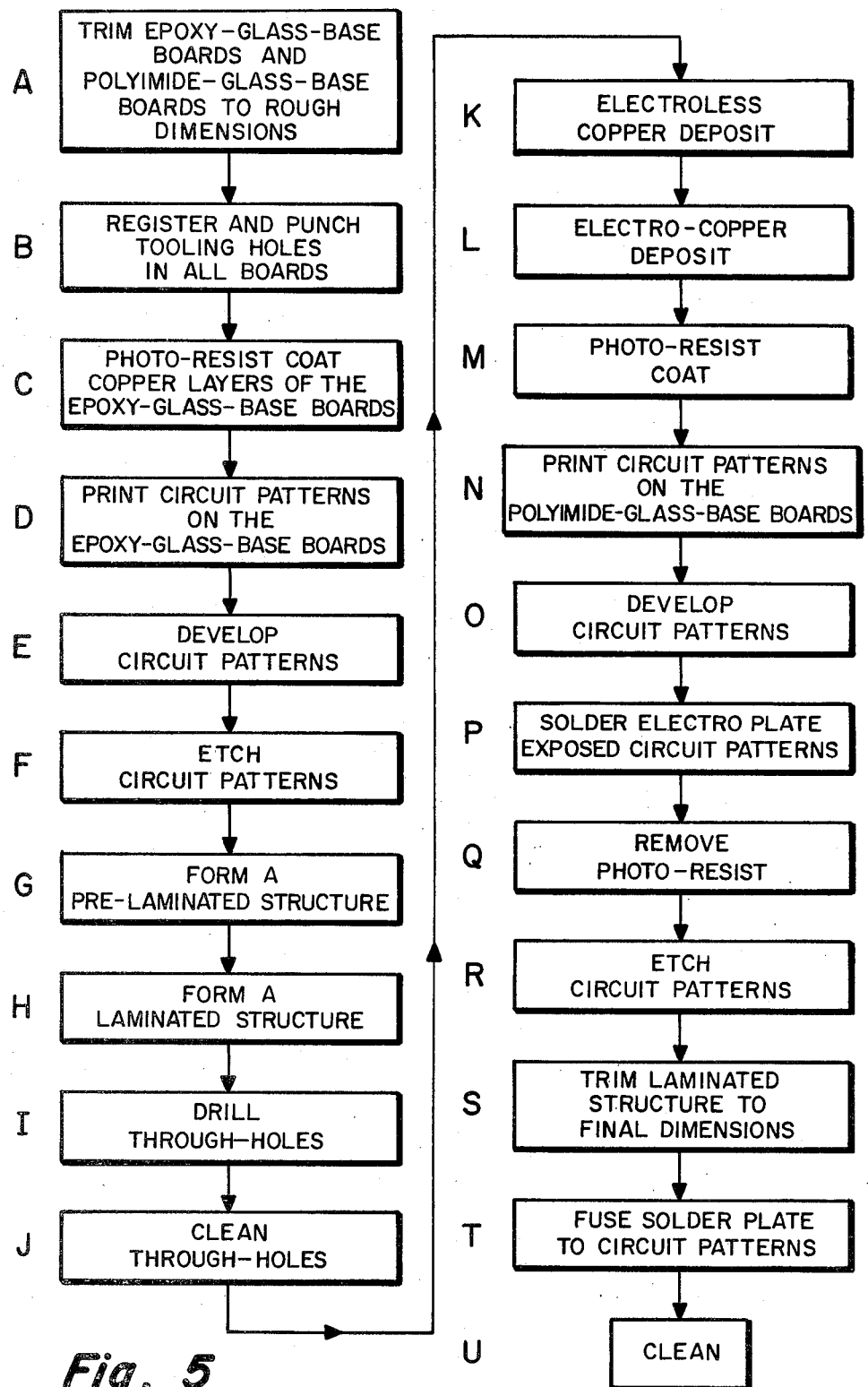
FIG. 5 is a flow diagram illustrating a typical series of steps that may be followed in preparing the hybrid printed circuit board of FIG. 1.

With particular reference to FIG. 4 there is illustrated a cross-sectional view of multi-layer printed circuit board 10 taken along line 4—4 of FIG. 2 for the purpose of illustrating the stacked superposed layers of multi-layer printed circuit board 10 in the area of placed through-holes 24.

In the illustrated method of the present invention, the hybrid multi-layer printed circuit board 10 is comprised of:

two printed circuit boards 12 and 13 each formed of a three mil (0.003 inch) core polyimide-glass-base having one ounce (oz) copper-clad on one side only;

four printed circuit boards 14, 15, 16 and 17 each formed of a four mil core epoxy-glass-base having one ounce copper-clad on two sides; and thirteen prepreg (B stage) layers 28 formed of a four mil epoxy glass.

The top and bottom polyimide-glass-base boards 12 and 13 sandwich the four epoxy-glass-base boards 14, 15, 16 and 17 therebetween with:

two prepreg layers 18 between each of the top and bottom polyimide-glass-base boards 12 and 13 and the adjacent epoxy-glass-base boards 14 and 17; and, three prepreg layers 18 between each of the adjacent epoxy-glass-base boards 14, 15, 16 and 17.

The hybrid multi-layer printed circuit board 10 in the present invention is fabricated by the steps of the following method:

A. Initially, boards 12 through 17 are cut to the desired rough dimensions—18 inches by 11 inches.

B. After cutting boards 12 through 17 to the desired rough dimensions, a plurality of tooling holes 20, each of ¼ inch in diameter, are registered and punched into the boards 12 through 17 of step A; such tooling holes are punched outside of the final trim lines.

C. After forming boards 12 through 17 to the desired rough dimensions and the punching of the tooling holes therein, boards 14 through 17 are now ready to have the desired copper circuit patterns formed in their copper layers. The circuit patterns may be formed in accordance with procedures well known in the printed circuit art today. In the procedure followed by the applicants, a commercial, positive photo-resist solution AZ-111, manufactured by Shipley Co., Newton, Mass. is dip coated on the copper layers of boards 14 through 17. The photo-resist is air dried over a period of approximately 20 minutes and then oven baked for a period of approximately 15 minutes at a temperature of 150°.

D. Next, for the printing operation, photo negatives having the predetermined arrangements of the desired circuit patterns, which are prepared by any well known means, are placed over the copper layers of of boards 14 through 17. The Colight printer used by applicants to develop the photo-resist is manufactured by Colight Inc., Minneapolis, Minn. and requires a six minute printing time for applicant's procedure; however, such printing time is a function of many variables and must be determined empirically for each operation.

E. Next, in the development step for forming the predetermined circuit patterns in the copper layers of boards 14 through 17, boards 14 through 17 are dipped in a tank of AZ-303 developer, manufactured by the Shipley Company, for a period of two minutes, or until the image is clearly defined, after which it is rinsed with tap water. What remains are layers of "fixed" AZ-111 photo-resist having patterns defining the circuit patterns desired to be established in the copper layers of boards 14 through 17.

F. Next, in the etching step, wherein the desired circuit patterns are formed in the copper layers of boards 14 through 17, boards 14 through 17 are installed in a suitable etching tank having the desired etching solution therein whereby the etchant is splashed against the exposed copper surfaces of boards 14 through 17 chemically machining away such exposed copper surfaces. In applicant's method, boards 14 through 17 are installed on a conveyor of Model 547 Chem-Cut etcher, manufactured by the Chem-Cut Corp., State College, Pennsylvania with the etchant solution being sprayed upon the exposed copper surfaces of boards 14 through 17. In this etching step, applicants used an etchant solution of chromic-sulphyric such as Hunt's 826, manufactured by the Phillip A. Hunt Chemical Corp., Palisades Park, N.J. The developed photo-resist is then immersed in an acetone solution for a period of approximately 2 minutes or until all evidence of photo-resist is removed.

G. Next, boards 12 through 17 are arranged into a pre-laminated structure by sandwiching the two-sided copper-patterned epoxy-glass/base printed circuit boards 14, 15, 16 and 17 of step F between the two single-sided copper polyimide-glass-base boards 12 and 13 of step B with the copper layers thereof exposed and with two B stage prepreg layers 18 between boards 12 and 14 and between boards 13 and 17 and with three B stage prepreg layers 18 between each of the adjacent boards 14 and 15, 15 and 16 and 16 and 17.

H. Next, the pre-laminated structure of step G is formed into a laminated structure by applying heat and pressure thereto. The pre-laminated structure of step H is placed into a machine press whose press plate registration pins extend through the registration, or tooling, holes 20 formed in step B. The pre-laminated structure of step G is now formed into a laminated structure by being cured in a machine press for one hour at 350° F. at 500#/sq. in. (psi).

I. Next, the plurality of through-holes 24 in laminated structure of step H are formed. In applicants' method the through-holes 24 of 0.038 inch diameter are formed by a numerically controlled drilling machine.

J. Next, the through-holes 24 formed at step I are freed of resin smear by dipping the boards 12 through 17 into a chromic-sulphuric solution, washed and dried.

K. Next, the laminated structure of step J is subjected to an electroless copper deposit for depositing upon all depositable surfaces, including all through-holes 24, an electrically conductive layer. Applicants' procedure includes: immersing in Shipley's conditioner Number 1175 for three to five minutes at 150° F. to 180° F.; water rinsing, immersing in a 20% by weight solution of technical grade ammonium persulfate for 30 seconds to three minutes; water rinsing; immersing in a 20% by volume sulphuric acid solution for 15 seconds to two minutes and agitating; water rinsing; immersing in 25% by volume hydrochloric acid for 15 seconds to 5 minutes and agitating; immersing in Shipley's Cuposit catalyst 9F for three to ten minutes and agitating; water rinsing; immersing in a 20% solution of sulphuric acid for 10 to 60 seconds and agitating; and, water rinsing.

L. Next, the laminated structure of step K is subjected to an electro-copper deposit for depositing upon all exposed surfaces, specifically including through-holes 24, a copper layer of 0.0015 inch. Applicants' procedure includes: copper electroplating 10 amps per square foot for the first three minutes and then increasing current density to 25 amps per square foot; continuing the copper electroplating at 25 amps per square foot for the time that is necessary to exceed the minimum specified thickness of 0.0015 inch in the plated through-holes 24; removing the board from the plating tank; water rinsing; and, drying with a warm air blast.

M. Next, photo-resist coat all exposed surfaces as in step C.

N. Next, print with artwork tooling the desired circuit patterns on the exposed copper layers of the top and bottom surfaces of boards 12 and 13 as in step D.

O. Next, develop the circuit patterns in the copper layers as defined by the artwork tooling of step N as in step E. The circuit patterns in the copper layers are developed by removing the photo-resist patterns printed in step N as in step F.

P. Next, the exposed circuit patterns of step O are electrosolder plated. The laminated structure of step O is dipped into a solder-plating bath whereupon the exposed patterns are solder-plated in accordance with well-known procedures.

Q. Next, the photo-resist layers of step O are removed as in step F.

R. Next, the exposed circuit layers of step Q as defined by the solder-plated patterns of step P are chemically etched wherein the desired circuit patterns are formed in the exposed copper layers of boards 12 and 13. This etching step is achieved by installing the laminated structure of step R in a suitable etching tank having the desired etching solution therein whereby the etchant is splashed against the exposed copper surfaces chemically machining away such exposed copper surfaces. This may be similar to step F.

S. Next, the laminated structure of step R is trimmed to final dimensions.

T. Next, the solder plate of step P is fused to the circuit patterns of step R by immersion in an hot oil solution for 20 to 30 seconds at 425° to 450° F.

U. Lastly, the laminated structure of step T is cleaned by water rinsing and drying by a warm air blast.

What is claimed is:

1. A method of fabricating a hybrid multilayer printed circuit board comprising:

trimming to rough size a plurality of double-copper-clad epoxy-glass-base boards;

forming circuit patterns in the top and bottom copper layers of said epoxy-glass-base boards;

trimming to rough size two single-copper-clad polyimide-glass-base boards:

forming a pre-laminated structure by sandwiching said plurality of said epoxy-glass-base boards between said two polyimide-glass-base boards with the copper layers thereon exposed and with one or more layers of B stage prepreg containing an epoxy resin inserted between each of said sandwiched and said sandwiching boards;

forming a laminated structure of said pre-laminated structure by applying pressure and heat thereto;

forming through-holes in said laminated structure;

forming circuit patterns in the copper layers of said polyimide-glass-base boards; and, trimming said laminated structure to final size.

2. A method of fabricating a hybrid multilayer printed circuit board comprising:

forming a plurality of printed circuit-pattern-supporting epoxy-glass-base boards;

forming two printed circuit-pattern-supporting polyimide-glass-base boards;

forming a pre-laminated structure by sandwiching said plurality of said epoxy-glass-base boards between said two polyimide-glass-base boards with one or more layers of an insulative adhesive between each of said sandwiched and said sandwiching boards; and, forming a laminated structure of said pre-laminated structure.

* * * * *